(12) United States Patent
Safavi-Naeini et al.

(10) Patent No.: US 10,768,214 B2
(45) Date of Patent: Sep. 8, 2020

(54) MULTI-VIEW PLANAR NEAR-FIELD SCATTERING TOMOGRAPHY SYSTEM

(71) Applicant: OZ Optics Ltd., Ottawa (CA)

(72) Inventors: Safieddin Safavi-Naeini, Waterloo (CA); Shahed Shahir, Waterloo (CA)

(73) Assignee: OZ Optics Limited, Ottawa (CA)

( * ) Notice: Subject to any disclaimer, the term of this patent is extended or adjusted under 35 U.S.C. 154(b) by 192 days.

(21) Appl. No.: 15/699,051

(22) Filed: Sep. 8, 2017

(65) Prior Publication Data

US 2018/0074103 A1    Mar. 15, 2018

(30) Foreign Application Priority Data

Sep. 9, 2016   (CA) ..................................... 2941487

(51) Int. Cl.
  *G01R 27/32*   (2006.01)
  *G01R 27/06*   (2006.01)
  *G01N 22/00*   (2006.01)
  *G01R 29/08*   (2006.01)

(52) U.S. Cl.
  CPC ............. *G01R 27/32* (2013.01); *G01N 22/00* (2013.01); *G01R 27/06* (2013.01); *G01R 29/0821* (2013.01)

(58) Field of Classification Search
  CPC ........ G01N 22/00; G01R 27/06; G01R 27/32; G01R 29/0821
  USPC ....... 702/57, 65, 81; 250/336.1; 315/111.21; 703/5, 13
  See application file for complete search history.

(56) References Cited

U.S. PATENT DOCUMENTS

| 7,560,869 B2* | 7/2009 | Miles ..................... G01N 22/00 219/121.6 |
| 7,728,295 B2* | 6/2010 | Miles ..................... G01N 22/00 219/121.6 |
| 8,706,455 B2* | 4/2014 | Van Beurden ...... G03F 7/70625 703/2 |
| 8,731,882 B2* | 5/2014 | Van Beurden ...... G03F 7/70625 356/498 |

FOREIGN PATENT DOCUMENTS

WO          92/03745 A1     3/1992

OTHER PUBLICATIONS

Bolomey, J. CH. et al., "Microwave Diffraction Tomography for Biomedical Applications", IEEE Transactions on Microwave Theory and Techniques, 30(11):1998-2000, Nov. 1982.
(Continued)

*Primary Examiner* — John H Le
(74) *Attorney, Agent, or Firm* — Hoffmann & Baron, LLP (57) ABSTRACT

A multi-view planar near-field scattering tomography system is provided herein. In one aspect the system is developed based on the reformulated signal subspace approach. Utilized for solving the electromagnetic inverse scattering problem, the signal subspace approach is reformulated. The present invention pertains to a computationally efficient approach to an electromagnetic inverse scattering-based permittivity profile estimation technique. In a second aspect, the system is developed at the millimeter-wave and THz frequency range to ensure accuracy by eliminating the multipath effects and without the need for an Anechoic chamber or water as a background medium for clinical, security, and manufacturing applications.

2 Claims, 5 Drawing Sheets

(56) References Cited

OTHER PUBLICATIONS

Fang, Qianqian et al., "Viable Three-Dimensional Medical Microwave Tomography: Theory and Numerical Experiments", IEEE Trans Antennas Propag., 58(2):449-458, Feb. 1, 2010.

Gilmore, Colin et al., "A Wideband Microwave Tomography System With a Novel Frequency Selection Procedure", IEEE Transactions on Biomedical Engineering, 57(4):894-904, Apr. 2010.

Larsen, Lawrence E. et al., "Microwave scattering parameter imagery of an isolated canine kidney", Med. Phys. 6(5):394-403, Sep./Oct. 1979.

Shahir, Shahed, "Near-Field Scattering Tomography System for Object Imaging and Material Characterization", Electrical and Computer Engineering Ph.D. Thesis presented to University of Waterloo, Ontario, Canada, 2015.

European Search Report for Application No. 17190306.5-1559, dated Nov. 24, 2017.

\* cited by examiner

MULTI-VIEW PLANAR NEAR-FIELD SCATTERING TOMOGRAPHY SYSTEM

CROSS-REFERENCE TO RELATED APPLICATION

This application claims priority to Canadian Patent Application No. 2941487, filed on Sep. 9, 2016, the contents of which is incorporated herein by reference in its entirety.

TECHNICAL FIELD

A multi-view planar near-field scattering tomography system is provided herein. In one aspect, the electromagnetic inverse scattering problem is reformulated based on the signal subspace approach. The system developed based on the subspace approach is computationally efficient approach to electromagnetic inverse scattering-based permittivity profile estimation.

In a second aspect the system is implemented at the millimeter-wave and THz frequency range to ensure accuracy by eliminating the multipath effects and without the need for an Anechoic chamber or water as a background medium for clinical, security, and manufacturing applications.

BACKGROUND

Electromagnetic inverse scattering is one of the most effective approaches for imaging and estimating the permittivity of unknown scatterers.

Electromagnetic inverse scattering has many applications in the pharmaceutical industry, such as pharmaceutical industry quality control. Other exemplary areas of use include medical imaging, cancer diagnosis and treatment, remote sensing, radio-astronomy, industrial quality control, security, and defence. The spatial permittivity or permittivity profile estimation of objects has been investigated widely using volume equivalent current source (VECS) formulation and solving the electromagnetic inverse scattering equation. In general, existing methods for permittivity profile estimation can be categorized into three main approaches radiating, non-radiating, and noise VECS. Electromagnetic Scattering Tomography system is an inspiring alternative to existing imaging modalities. The need for an alternative imaging system to complement the existing medical imaging modalities is undeniable in today's medical health care practice. The biological tissue screening and examinations are done by means of magnetic resonance, computed tomography (CT), x-ray, and ultrasound imaging modalities. Magnetic resonance images (MRIs) are good for imaging the soft tissues but not hard tissues (i.e. bones or teeth). CTs are used for imaging and diagnosis of the hard tissues in practice but not soft tissues. Ultrasound cannot be used for imaging inside the hard tissues but can be used for imaging the outer surface of hard tissues. Since all parts in a living biosystem are dielectric in nature, they can be considered as lossy dielectric and electromagnetic waves can penetrate inside the biosystem. For that reason, several electromagnetic imaging systems were developed to meet the high demand for an alternative imaging modality for clinical applications.

Depending on the shape of the observation domain, the electromagnetic scattering based imaging systems are classified into two main categories: planar imaging and non-planar imaging. A brief review of the existing planar electromagnetic scattering systems reported in literature is presented below.

A planar electromagnetic scattering system for coherent projection imaging has been reported. In some systems, the planar electromagnetic scattering computerized tomography was developed without considering diffraction or scattering phenomenon. Since they assumed that electromagnetic fields propagate through a scatterer in a straight line, the transmitting and receiving antennas were moved around the stationary scatterer over 180°, similar to CT. This is not a valid assumption for electromagnetic scattering imaging system. Later on, for faster scanning speeds, the electronic raster scanning of the electric fields was considered. Generally speaking, the electronic raster scanning based tomographic systems suffer from a few drawbacks: 1) the measurement fields are disturbed by the antenna elements placed adjacent to the receiving antenna element and 2) the receiving antenna elements are cross-talked.

The electromagnetic scattering tomography systems are implemented in an Anechoic chamber to control the multi-path effects. Since using an Anechoic chamber is not an option for clinical applications, water has been widely used as the background medium for the electro-magnetic scattering imaging system for reducing the multipath effects and lowering the contrast of the scatterer. To have images with higher resolution, higher frequency is recommended; higher frequencies increase the electric field attenuation in water.

SUMMARY

To address the aforementioned issues and alleviate these difficulties, one aspect of the present invention sets forth a new planar near-field scattering tomography (NFST) system capable of reconstructing tomographic images in multi-view. One aspect of the system uses the millimeter-wave frequency range which enables minimization of multipath effects. In one aspect a transmitting antenna remains stationary throughout the measurement, and a probe moves over the measurement plane using an advanced scanner for measurements. Even though the mechanical scan is not as fast as an electronic scan, the proposed system does not suffer from the errors due to the field disturbance caused by the adjacent receiving antennas, the cross-talks among the antennas, coupling between the antennas, and/or the mismatch between the different channels in an electronic scan, which are problem that arise in previous solutions. Furthermore, in contrast with the system reported by H. Ermert and M. Dohlus, "*Microwave-diffraction-tomography of cylinderical objects using 3-Dimensionalwave-fields*" NTZ Archiv: Archiv fur Nachrichtentechnik der ntz, vol. 8, no. 1, pp. 110-117, 1986, the incident field is measured in the absence of the scatterer once by using the same transmitting and receiving antennas during the calibration stage without any additional alignment.

The system development at the millimeter-wave and THz frequency range ensures high accuracy by eliminating the multipath effects and without the need for an Anechoic chamber or water as a background medium for clinical, security, and manufacturing applications. Due to the small wavelength at this frequency range, the system calibration is very challenging and complex.

Thus, a first aspect pertains to an electromagnetic inverse scattering problem formulation based on the signal subspace approach which is computationally cost effective for imaging and permittivity profile estimation in multi-view. The technique can successfully estimate low contrast permittivity profiles, high contrast permittivity profiles, and non-homogeneous permittivity profiles. It can be extended to estimate a continuously inhomogeneous dielectric object by subdividing the inhomogeneous region into a sufficient number of homogenous sub-regions.

In a second aspect, the system is implemented at the millimeter-wave and THz frequency range to ensure accuracy by eliminating the multipath effects and without the need for an Anechoic chamber or water as a background medium for clinical, security, and manufacturing applications.

The permittivity profile estimation is based on electromagnetic inverse scattering and introduces the 4th dimension, thereby revolutionizing existing imaging system technologies. The 4th dimension is permittivity, while attenuation (gray-scale) and spatial information (x,y) are the other existing dimensions. The present technique enables 4-D imaging in all ranges of the electromagnetic spectrum: X-Ray, ultraviolet, visible light, infrared, Terahertz, and microwave.

The inverse source problem is divided into two sub-categories: a radiating part and a non-radiating part of the VECS. The radiating part of VECS is obtained by solving the well-conditioned inverse scattering problem. Two new notions—a non-radiating contrast factor and non-radiating internal scattered field—are introduced. The two notions enable definition of the external non-radiating scattered field caused by the non-radiating VECS as the cost function. A dielectric permittivity profile can be estimated by minimizing the cost function (i.e. $l^2$-Norm of the external scattered field due to the non-radiating VECS) unlike in other existing techniques that use initialization, linearization and iteration, for this purpose. Any optimization methods, such as least square error, maximum likelihood, maximum a posteriori, can be used for minimization.

One embodiment of the second aspect of the present application pertains to a new permittivity profile estimation technique, based on radiating/non-radiating VECS. Electromagnetic inverse scattering problems are inherently ill-conditioned and ill-posed. The presented approach formulates the inverse scattering problem in terms of radiating and non-radiating VECS. Unlike in other existing techniques that use initialization, linearization and iteration, the present technique employs the least square error to minimize the $l^2$-Norm of the external scattered field due to the non-radiating VECS and so obtains highly accurate permittivity profiles. The simulation results show that the present invention successfully estimate low contrast permittivity profiles, high contrast permittivity profiles, and non-homogeneous permittivity profiles. The present invention can be extended to estimate a continuously inhomogeneous dielectric object by subdividing the inhomogeneous region into a sufficient number of homogenous subregions. The present invention makes 4-D imaging possible, with widespread applications in medical imaging systems for diagnostic radiology, in remote sensing for natural and mineral resource exploration, and in many other applications: pharmaceutical (counterfeit detection, drug coating thickness evaluation), transportation (pavement assessment), and industrial processes (online quality control).

DETAILED DESCRIPTION OF PREFERRED EMBODIMENTS

Tomography Systems Based on Electromagnetic Scattered Felds

To begin with, the electromagnetic inverse scattering problem formulation based on the signal subspace approach is reformulated. The values of the contrast factor distribution inside and outside the object under test (OUT) are non-zero and zero, respectively, if OUT is considered within the region of interest (ROI) (OUT⊂ROI). The OUT spatial contrast factor distribution, $\kappa_r$, is complex and unknown, and is defined as follows provided that the free space is the background medium, $$\kappa_r = \epsilon_r - 1 - j\frac{\sigma}{\omega\epsilon_0}, \quad (1)$$

where $\epsilon_r$, $\epsilon_0$, $\omega$, and $\sigma$ are the relative permittivity, the free space permittivity, the angular frequency, and conductivity. Since the location and boundary of the OUT are unknown, $\kappa_r$ is estimated over ROI from the electric field measured over the observation plane, $\upsilon_{obs}$, outside ROI. Provided that, in ROI, the media have a homogenous magnetic permeability profile, the total electric field satisfies the complex vector wave equation:

$$\nabla\times\nabla\times\vec{E}_{scat} - \omega^2\mu_0\epsilon_0\vec{E}_{scat} = -j\omega\mu\vec{J}_{eq}, \quad (2)$$

where $$\vec{J}_{eq} = j\omega\epsilon_0\kappa_r\vec{E}_{tot}, \quad (3)$$

$$\vec{E}_{tot} = \vec{E}_{inc} + \vec{E}_{scat}, \quad (4)$$

and $\vec{E}_{tot}$, $\vec{E}_{scat}$, $\vec{E}_{inc}$, $\vec{J}_{eq}$, and $\mu_0$ are the total electric field, the scattered electric field, the incident electric field, VECS, and the free space permeability, respectively. The scattered electric field can be obtained as follows:

$$\vec{E}_{scat}(\vec{r}) = -j\omega\mu \int \left(1 + \frac{1}{k^2}\nabla\nabla\cdot\right)g(\vec{r},\vec{r}')\vec{J}_{eq}(\vec{r}')dv', \quad (5)$$

where k is the wave number ($\omega\sqrt{\mu\epsilon}$), and $g(\vec{r},\vec{r}')$ is the scalar Green's function, $$g(\vec{r},\vec{r}') = \frac{e^{-j(k|\vec{r}-\vec{r}'|)}}{4\pi|\vec{r}-\vec{r}'|}, \quad (6)$$

and $\vec{r}$ and $\vec{r}'$ the vectors that locate the observation point and the source point, respectively.

The scattered field generated by the VECS in a homogeneous medium for two dimensional $TM_y$ can be obtained [31] as follows:

$$E_{scat}(\vec{r}) = -j\omega\mu\hat{y}\int_{ROI}G_a(\vec{r},\vec{r}')J_{eq}(\vec{r}')dv', \quad (7)$$

where $$G_a(\vec{r}, \vec{r}') = \frac{H_0^{(2)}(k|\vec{r}-\vec{r}'|)}{4j},$$

and the VECS has a single component in $\hat{\gamma}$ direction ($\vec{J}_{eq} = J_{eq}\hat{\gamma}$).

The scattered electric field equation (7) can be discretized by dividing ROI into the q number of elements. By applying the Method of Moments (MOM), the scattered electric field equation (7) can be written for the p number of elements in $\upsilon_{obs}$ in a matrix form:

$$E_{scat} = G_e J_{eq}, \tag{8}$$

where $E_{scat}$ is the p×1 single column matrix, and $J_{eq}$ is the q×1 total VECS single column matrix, defined as, $$J_{eq} = j\omega\epsilon_0 \kappa_r E_{tot}, \tag{9}$$

$E_{tot}$ is the q×1 single column matrix whose $n^{th}$ element is the average total electric field at $ROI^n$, the $n^{th}$ discretized element of ROI; $\kappa_r$ is a q×q diagonal matrix whose $n^{th}$ diagonal element is the average contrast factor at $ROI^n$; $G_e$ is the p×q Green's function matrix wherein the $m^{th}$ row and $n^{th}$ column element of the electric field Green's function matrix, $G_{e\ mn}$, is:

$$G_{e\ mn} = -j\omega\mu \int_{ROI^n} G_a(\vec{r}_m, \vec{r}) d\upsilon'. \tag{10}$$

The successful estimation of the contrast factor profile depends on the solution to the inverse source problem, which is non-unique. To work around the ill-posedness of the inverse source problem, the $E_{scat}$ and $J_{eq}$ are transferred into the new subspaces and are represented as the spans of the new bases, $u_i$ and $v_i$, respectively, $$E_{scat\ m} = \sum_{i=1}^{p} \alpha_i u_{i\ m}, m = 1, 2, \ldots, p \tag{11}$$

$$J_{eq\ n} = \sum_{i=1}^{q} \beta_i v_{i\ n}, n = 1, 2, \ldots, q \tag{12}$$

where $E_{scat\ m}$ is the $m^{th}$ element of $E_{scat}$; $J_{eq\ n}$ is the $n^{th}$ element of $J_{eq}$; $\alpha_i$ represents the $i^{th}$ complex coefficient of the orthonormal basis of the scattered electric field; and $\beta_i$ represents the $i^{th}$ coefficient of the orthonormal basis of VECS. Equations (11) and (12) represent the orthogonal expansions of the scattered electric fields and VECS's, respectively. $\alpha_i$ can be determined as follows:

$$\alpha_i = \sum_{m=1}^{p} u_{i\ m}^{\dagger} E_{scat\ m}, i = 1, 2, \ldots, p \tag{13}$$

† represents the Hermitian transpose; $u_{i\ m}$ is the $i^{th}$ row element of the $m^{th}$ column basis of the scattered fields, U; $v_{i\ n}$ is the $i^{th}$ row element of the $n^{th}$ column basis of the source, V; $\alpha_i$ is bounded and well behaved.

The VECS orthogonal coefficient, $\beta_i$, can be obtained thus:

$$\beta_i = \frac{\alpha_i}{s_i}, i = 1, 2, \ldots, q, \tag{14}$$

where $s_i$ represents the $i^{th}$ diagonal element of S provided that the spatial Green's function representation, G, is decomposed into the Green's function modal representation, S, and two orthogonal matrices using the singular value decomposition as $G = USV^{\dagger}$. The $\beta_i$ calculation is not as straightforward as the $\alpha_i$ calculation because the $s_i$ decays faster than the corresponding $\alpha_i$. The $\beta_i$ stability directly depends on the $s_i$ value. To discuss the $\beta_i$ stability, we categorize the $s_i$ range into three subregions: radiating, non-radiating, and noise by using two threshold indexes: $L_{RAD}$ and $L_{noise}$. The first threshold index, $L_{RAD}$, separates the radiating VECS bases and the non-radiating VECS bases. The second threshold index, $L_{noise}$, separates the non-radiating VECS bases and the noise bases. Below the $L_{RAD}$ threshold, in the radiating subregion, both $s_i$ and $\alpha_i$ are bounded and well behaved. For that reason, we consider the radiating part of VECS when reconstructing the scatterer contrast factor. Thus, Equation (11), (12), (13), and (14) can be rewritten as follows:

$$E_{scat\ m}^{RAD} = \sum_{i=1}^{L_{RAD}} \alpha_i u_{i\ m}\ m = 1, 2, \ldots, p \tag{15}$$

$$J_{eq\ n}^{RAD} = \sum_{i=1}^{L_{RAD}} \beta_i v_{i\ n}\ n = 1, 2, \ldots, q \tag{16}$$

$$\alpha_i = \sum_{m=1}^{p} u_{i\ m}^{\dagger} E_{scat\ m}^{RAD}\ i = 1, 2, \ldots, L_{RAD} \tag{17}$$

$$\beta_i = \frac{\alpha_i}{s_i}\ i = 1, 2, \ldots, L_{RAD} \tag{18}$$

If the non-radiating subregion is represented by the spans of the bases with the indexes between $L_{RAD}$ and $L_{noise}$, $s_i$ starts decaying very fast in the non-radiating subregion. Thus, $\beta_i$ rises exponentially. The $\beta_i$ values could dominate and affect the results improperly if the non-radiating VECS properties are not taken into consideration. In the noise subregion, the $s_i$ values fluctuate around zero, with many sign changes. In the subregion, the inverse source problem is unstable.

The planar NFST system's noise level, $N_{level}$, is defined as follows:

$$N_{level} = \begin{cases} p a_{fp} a_{sm}, & q < p, \\ q a_{fp} a_{sm}, & p \leq q, \end{cases} \tag{19}$$

where $\alpha_{fp}$ and $\alpha_{sm}$ are the CPU floating-point relative accuracy and the measurement sampling accuracy, respectively. The $L_{noise}$ is the index of the system noise level, and $L_{RAD}$ is the modal threshold and will be discussed below in detail. In fact, the first $L_{RAD}$ bases represent the radiating bases; the bases between $L_{RAD}+1$ and $L_{noise}-1$ represent the non-radiating bases; and the bases beyond $L_{noise}$ represent the noise bases of the planar NFST system. The radiating part of VECS is used to calculate the radiating part of the contrast factor of a scatterer from the scattered fields measured at $\upsilon_{obs}$. The radiating VECS is proportional to the radiating contrast factor and inversely to the radiating internal total field. Thus, the radiating contrast factor can be obtained by using the radiating part of VECS (16), and is defined as, $$\kappa_{rn}^{RAD} = J_{eq\ n}^{RAD} / (j\omega\epsilon_0 E_{tot\ n}^{int\ RAD}), n = 1, 2, \ldots, q \tag{20}$$

where $J_{eqn}^{RAD}$ and $E_{tot\ n}^{int\ RAD}$ are the corresponding radiating VECS and total electric field at a point, $r_n$, denoted by n. The radiating internal total electric field, $E_{tot\ n}^{int\ RAD}$ is now defined by $$E_{tot}^{int\ RAD}(r_n) = E_{inc}(r_n) + E_{scat}^{int\ RAD}(r_n), \quad (21)$$

$$E_{scat}^{int\ RAD}(r_n) = -j\omega\mu \int_{ROI} G_\alpha(r_n, r') J_{eq}^{RAD}(r') dv', \quad (22)$$

and $r_n \in$ ROI and $r' \in$ ROI. In contrast with the Born's approximation, which makes the above equation linear by replacing the incident field with the total electric field, Equation (20) is non-linear as the nominator and denominator in (20) both are the function of the radiating VECS in this process.

The OUT is rotated into N different orientations ($\theta_i$, i=1, 2, ..., N) and is illuminated at each orientation. The electric fields are measured at $v_{obs}$; the radiating VECS's, the total internal electric fields, and the radiating contrast factors $\kappa_m^{RAD}(\theta_i)$ of OUT at each orientation are estimated. Since the radiating contrast factor remains unchanged regardless of the incident angle, the expected radiating contrast factor is defined as follows:

$$\kappa_n^{Exp} = \frac{1}{N}\sum_{i=1}^{N} \mathcal{R}_{\theta_i}^{-1}\{\kappa_{r,n}^{RAD}(\theta_i)\}, n = 1, 2, \ldots, q \quad (23)$$

The $\mathcal{R}_{\theta_i}^{-1}\{.\}$ operator rotates $\kappa_m^{RAD}(\theta_i)$ for $\theta_i$ degree to compensate for the rotation of the rotational stage and to move the rotated mesh back to its original orientation.

To prevent the solution instability, it is necessary to find the $L_{RAD}$ threshold. The threshold can be estimated using mean square error (MSE). By using MSE of the contrast factor, the $L_{RAD}$ is obtained by minimizing the MSE of the approximated contrast factor, $$L_{RAD} = \arg\min_{i=1}^{L_{noise}} \{F(\kappa_r^{Exp,i})\}, \quad (24)$$

where $F_i$ is the cost function and is defined as $$F(\kappa_r^{Exp,i}) = \sqrt{\frac{\int_{ROI}[\kappa_r^{Exp,i}(\vec{r}') - \kappa_r(\vec{r}')]^2 dv'}{\int_{OUT}[\kappa_r(\vec{r}')]^2 dv'}}, \quad (25)$$

$\kappa_r^{Exp}(\vec{r}')$ is the expected radiating contrast factor when the first i bases are considered as the radiating modes, and $\kappa_r(\vec{r}')$ is the calibration sample contrast factor. The $L_{RAD}$ based on MSE of the contrast factor is calculated once at each operational frequency in the NFS system calibration process.

Now that the mathematical background has been considered, a planar near-field scattering tomography system implementing the above-discussed approximation of the location and the boundary of OUT by using the radiating permittivity profile and the radiating conductivity profile of ROI follows.

The multi-view planar near-field scattering tomography system of the present invention operates at the millimeter-wave frequency range. The multipath effects can be efficiently controlled by using construction materials that are mostly very good absorbers of the electromagnetic fields at the millimeter-wave and THz frequency range. Ceilings, floors, and walls absorb all of the backscattered signals. Therefore, the proposed system is implemented in free space at the millimeter-wave and THz frequency range and does not need for an Anechoic chamber or water as a background medium to control the multipath effects. Furthermore, to minimize the shadowing effects, the OUT is illuminated over the full revolution (360°) in the proposed multiple-view tomography system.

Figure 1:
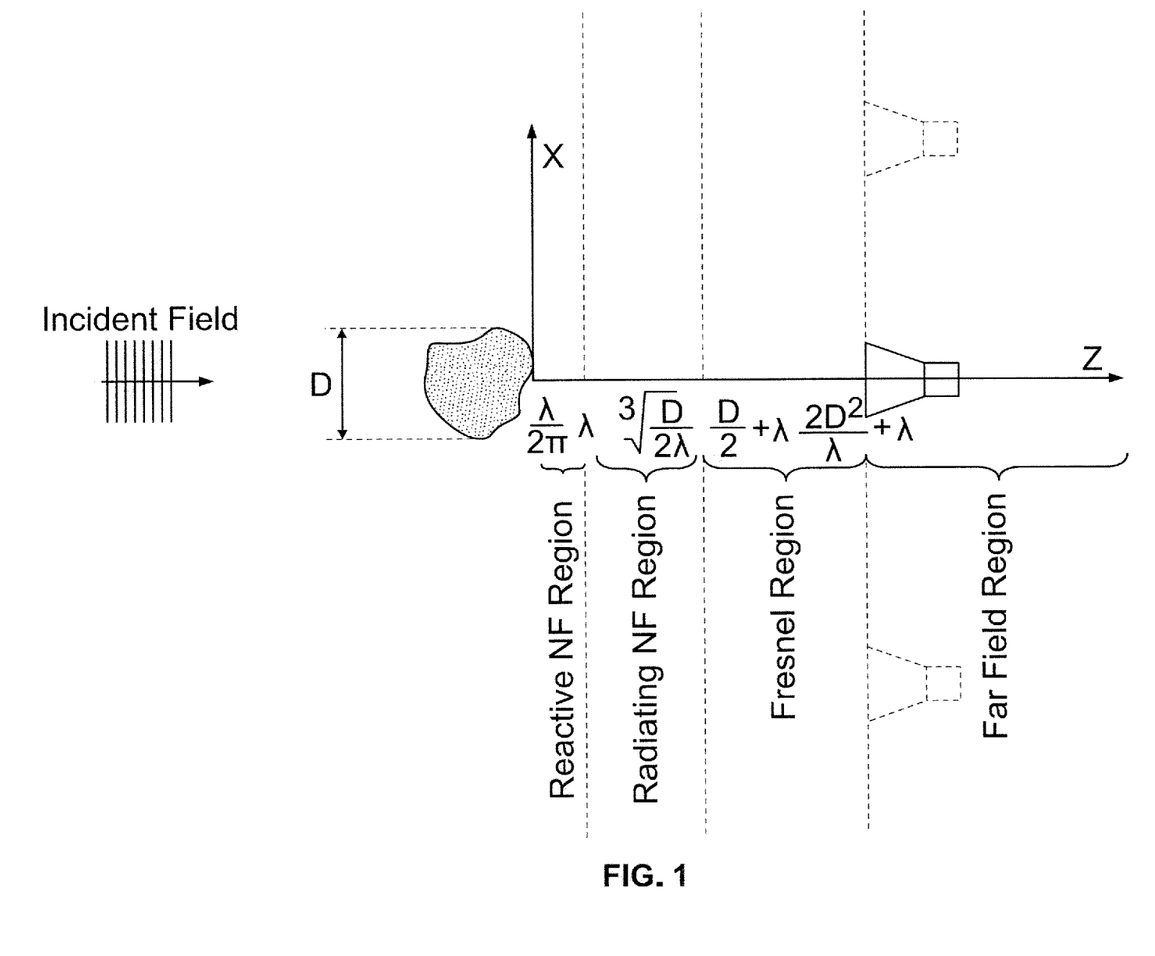
FIG. 1 shows an EM scattering imaging system classification.

A multi-view planar NFST system is considered as one example of an application of the present invention. The scattering field imaging systems are categorized based on the distance between the scatterer and the measurement domain into four different categories, namely, the reactive near-field, the radiating near-field, Fresnel, and far-field as shown in FIG. 1. Scattered from the OUT, the electromagnetic scattered fields measured in the reactive near-field and the radiating near-field regions carry more information about the fine features of the OUT (scatterer) than the electromagnetic scattered fields measured in the Fresnel and far-field regions. To avoid the coupling between the OUT and the receiving antenna, and to have enough information about the fine feature of the OUT, the tomographic image of the OUT is reconstructed with the electromagnetic field measurement in the radiating near-field region.

Figure 2:
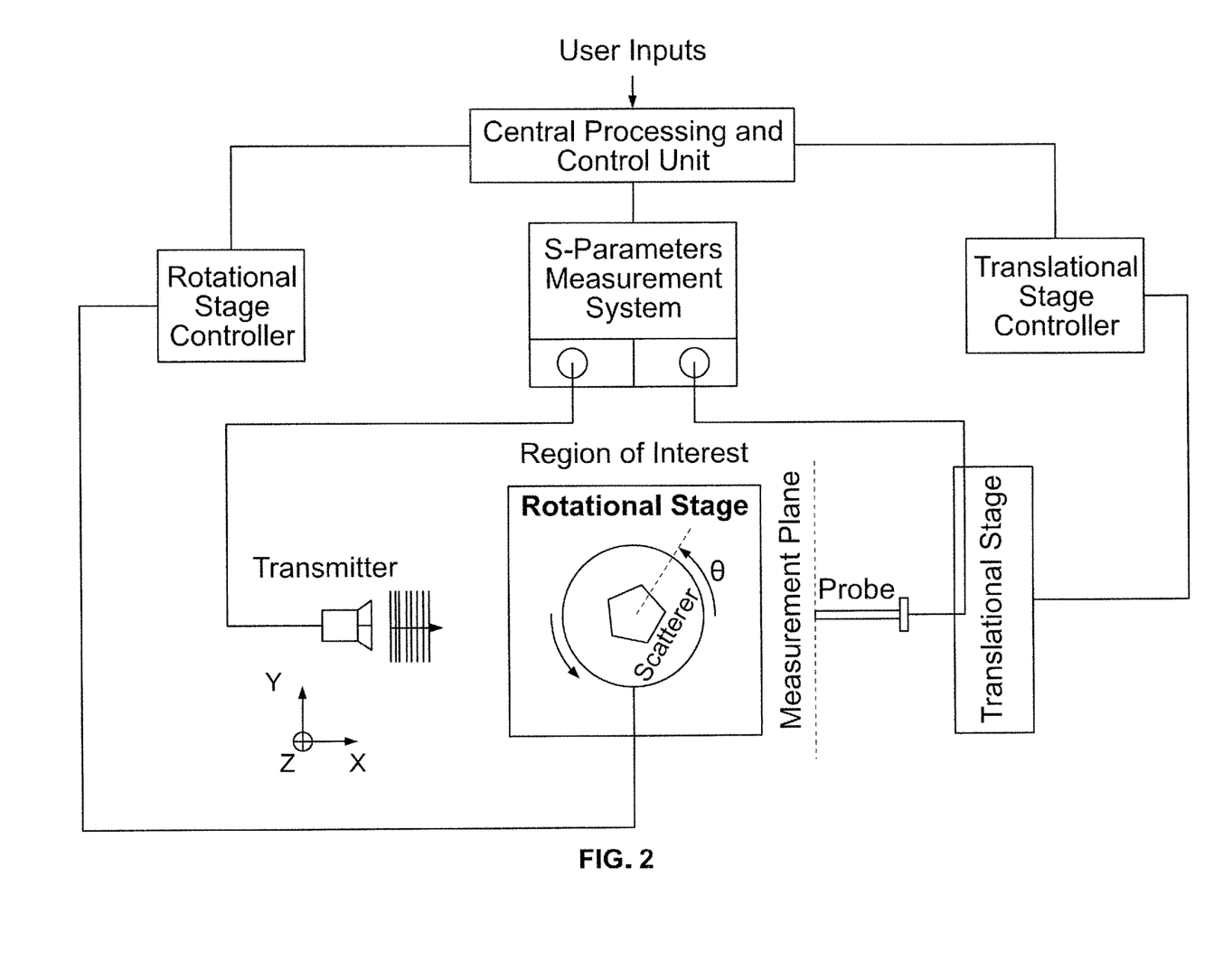
FIG. 2 shows the multi-view planar near-field scattering tomography (NFST) system block diagram.

The block diagram of the proposed NFST system is shown in FIG. 2. Any antennas designed for operation at the millimeter-wave and THz frequency range can be used to illuminate the OUT and receive the electromagnetic field outside the OUT as a probe. Antennas with higher gain improve the imaging system resolution substantially. To reduce the system cost, the incident field remains unchanged at all times in the proposed systems; instead, the OUT orientation is changed by utilizing a rotational stage as if OUT is illuminated from different angles. During experimentation, the planar NFST system was implemented and extensively evaluated by illuminating the OUT from different views (multi-view). In the example application, a full rotation (360°) was employed to minimize the shadowing effects for the multiple-view tomography system.

The multipath effects can be efficiently controlled since almost most of the construction materials are very good absorbers of the electromagnetic fields at millimeter wave and THz frequency range. Ceilings, floors, and walls absorb all the backscattered signals. Thin absorbers can be used to control the multipath effects where there is a metallic surface.

Therefore, one aspect of the present invention is implemented at the millimeter-wave and THz frequency range in free space without the need for an Anechoic chamber or water as a background medium. The transmitter preferably stays stationary at all time. In that case, the need for the additional translation stage for moving the transmitting antenna is eliminated, and there is no need for extra incident field measurements. Therefore, the present invention is low-cost financially and computationally.

In the implemented system, a high precision scanner is highly recommended for conducting accurate measurement over the planar observation domain to capture the evanescent wave in the near-field region. A vector network analyzer and harmonic modules are preferably used for s-parameter measurements at the millimeter-wave and THz frequency range. The imaging setup can be utilized to provide the flexibility for aligning the source, scatterer, and observation plane accurately. The high resolution rotational stage changes the OUT orientation accordingly. The Central Processing & Control Unit performs data collection and image reconstruction, and controls the illumination angle and the probe movement to meet the requirement for the defined application.

In one embodiment, the multi-view planar NFST system implementation and operation consist of the following steps:
Step 1) System calibration,
Step 2) Scanner initialization,
Step 3) The scattering parameter measurement and electric field calculation,
Step 4) Estimation of the radiating contrast factor,
Step 5) Changing illumination angle repeating the above measurements for different angles,
Step 6) Calculation of the expected radiating contrast factor, the permittivity profile and the conductivity profile.

The above six steps will now be explained in further detail in an example embodiment.

Step 1, system calibration, includes
1. Initializing the system,
2. Discretizing of the region of interest (ROI) as shown in FIG. 2,
3. Aligning the transmitting antenna effective aperture, the receiving antenna effective aperture, and the OUT lateral surface (for the 2D case) with the accuracy of half the maximum mesh size in the ROI or better,
4. Localizing the rotation axis center and/or the OUT in the scan coordinate system (X, Y, Z),
5. Determining the $S_{21}$-to-$E_{tot}$ conversion factor,
6. Measuring the incident electric field over the ROI and the measurement domain.

In Step 2, all of the measurement variables are initialized, and then, the scanner moves to the corresponding measurement location in the X, Y, and Z coordinates.

In Step 3, the scattering parameters are measured using a network analyzer, and then, the total electric field is calculated by using the $S_{21}$-to-$E_{tot}$ conversion factor.

In Step 4, the radiating contrast factor is estimated.

In Step 5, the OUT is illuminated by the incident field at different angles until a full rotation is completed, and the expected radiating contrast factor is reconstructed by averaging the spatial radiating contrast factor estimated for multi-view measurements.

In Step 6, the spatial radiating permittivity profile and the spatial conductivity profile are calculated from the averaged radiating contrast factor.

The multi-view planar NFST system of the present invention can be used to reconstruct OUT tomographic images. The advantages of the present invention over the existing planar microwave scattering tomography systems include the near elimination of external multipath effects in the present planar NFST configuration at the millimeter-wave frequency range without the need for an Anechoic Chamber or water as a background medium.

In one aspect the present invention reformulates a signal subspace based solution for solving the electromagnetic inverse scattering problem by transferring the scattered electric field and the volume equivalent current source (VECS) into the new subspaces with the orthonormal bases. The radiating and noise thresholds are defined, explicitly formulated, and are used for classifying the singular value subspace bases into three categories: radiating, non-radiating, and noise.

As if an observer seating outside OUT can see only the lateral surface of the OUT, but not it's inside. Similarly, the measurements conducted outside the object under test (OUT) carry the radiating information, but not the non-radiating one. Therefore, the radiating permittivity profile is estimated from the measured scattered field and the radiating VECS projected into the radiating bases for the tomographic image reconstruction.

Permittivity Profile Estimate

Figure 3:
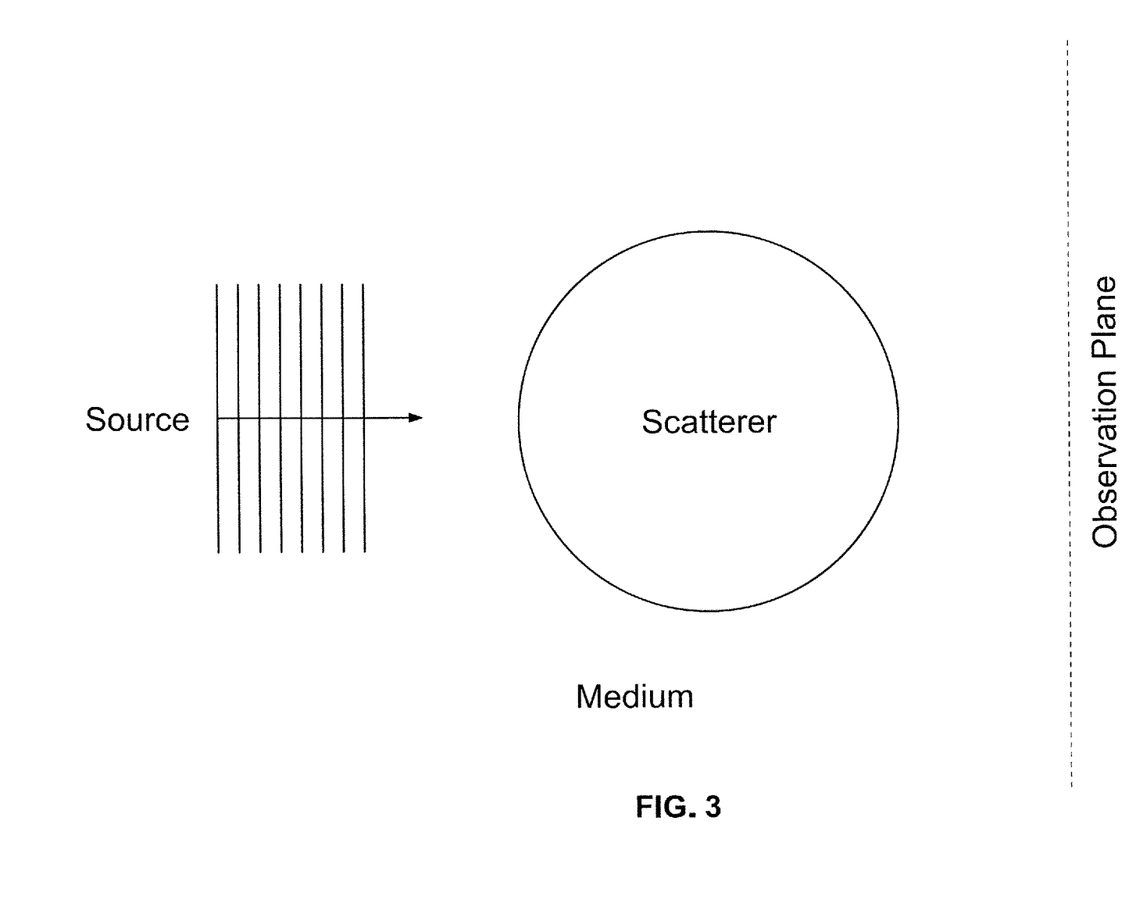
FIG. 3 shows the multi-view non-planar NFST system schematic.
Figure 4:
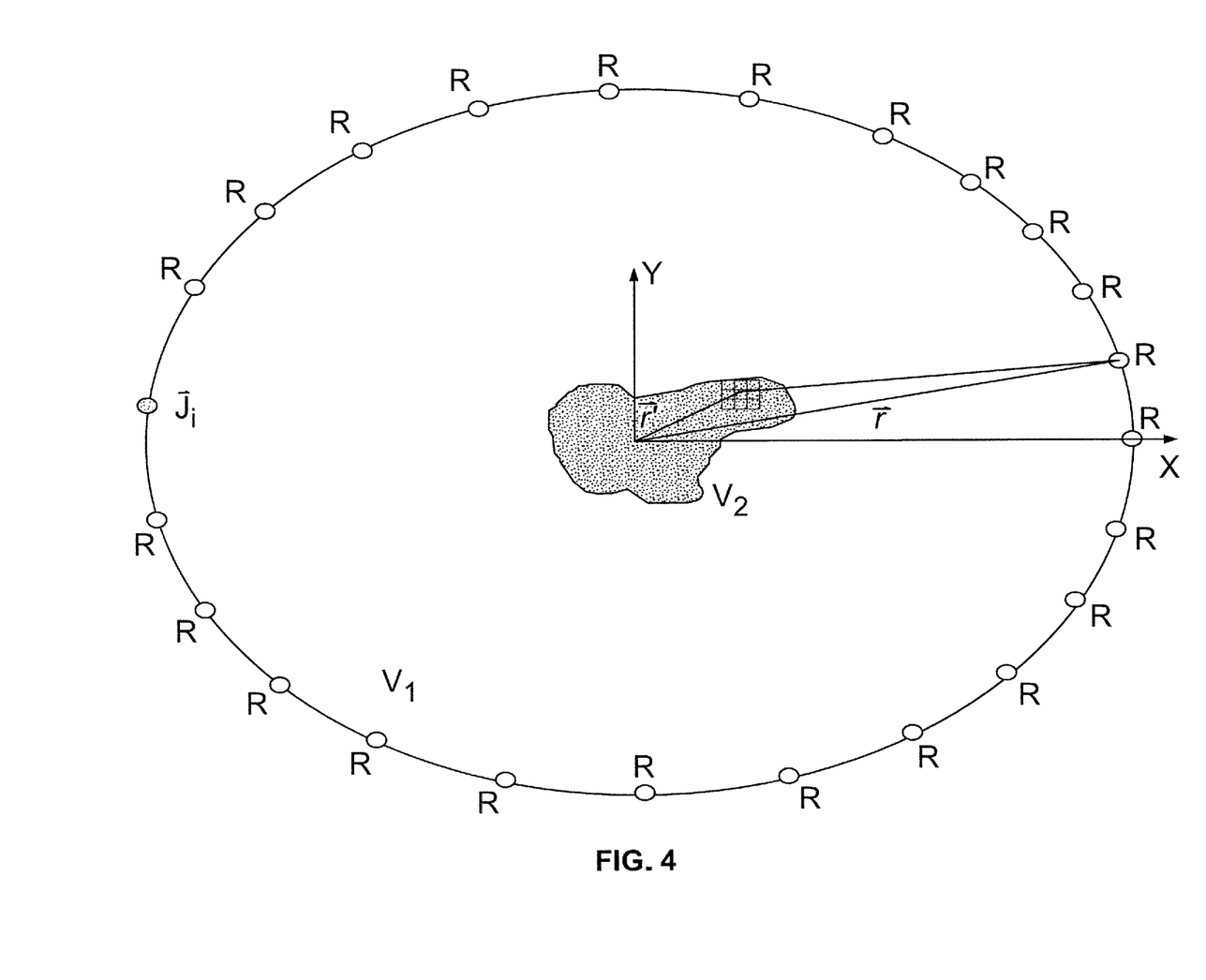
FIG. 4 shows the multi-view planar NFST system schematic.

The non-radiating VECS-based technique for permittivity profile estimation is general and applicable for all frequency ranges of electromagnetic radiation. The planar NFST system schematic is shown in FIG. 3. FIG. 4 shows the multi-view non-planar NFST system schematic.

The present invention estimates the permittivity profile using the data collected at observation points. One aspect of the present method is summarized as follows:
1. Measuring the incident electric fields at observation points in EMISS in the absence of any scatterers,
2. Illuminating the scatterer from different angles,
3. Measuring the total electric fields at the observation points for different angles in the presence of the scatterer,
4. Calculating the radiating VECS, the radiating total internal electric field, and the radiating contrast factor of the scatterer for each incident angle,
5. Determining the expected contrast factor and localizing the scatterer boundaries,
6. Estimating the non-radiating part of the contrast factor, which will be added to the radiating part to provide the total contrast factor and the scatterer permittivity profile.

Figure 5:
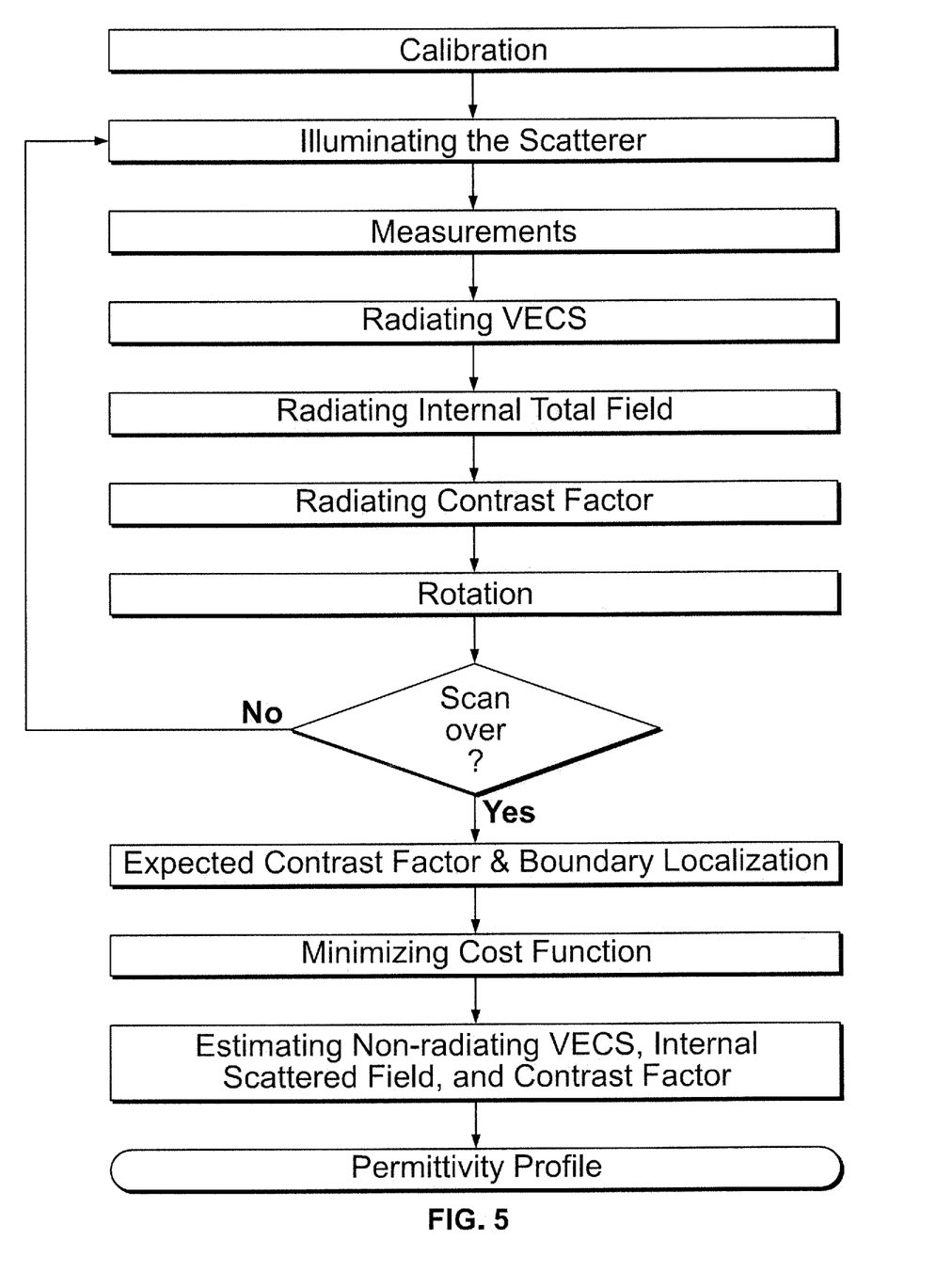
FIG. 5 shows a proposed permittivity profile estimation approach flow chart.

The non-radiating VECS technique design methodology is illustrated in FIG. 5.

The electromagnetic-inverse-scattering-based permittivity profile estimation is divided into radiating and non-radiating solutions.

For obtaining the radiating solution, electromagnetic inverse scattering problems are converted to a well-conditioned problems prior to solving through the aforementioned process. Following Step 4, the now well-conditioned Green's function matrix is used to solve the inverse scattering problem and to estimate the radiating VECS, $J_{eq}^{RA}$. The forward scattering equation is then employed to determine the radiating internal scattered field, $E_s^{int\ RA}$ using, $$E_s^{int\ RA} = G_e^{int} J_{eq}^{RA}, \quad (1)$$

where the Green's function matrix, $G_e^{int}$, is evaluated for the observation points inside the scatterer. The internal total electric field is now determined by $$E_t^{int\ RA} = E_i + G_e^{int} J_{eq}^{RA}. \quad (2)$$

The radiating contrast factor, can be obtained as follows:

$$k_T^{RA} = J_{eq}^{RA} j (j\omega \epsilon_0 E_t^{int\ RA}), \quad (3)$$

where "j" is the element-wise division operation. Any errors made in calculating the radiating VECS or total electric field directly affect the contrast factor. It is noted that the radiating contrast factor estimated above is one of the two parts sought for approximating a contrast factor. The second one is the non-radiating part. If the internal and external boundary information of the scatterer under test is available, the non-radiating VECS is estimated as explained below in the non-radiating solution; otherwise, the internal and external boundaries should be determined as explained here.

For boundary localization, the scatterer is illuminated from N different angles ($\theta_I$, I=1, 2, ..., N); the electric fields at the observation points are measured; the radiating VECS, the total internal electric field, and the radiating contrast factor $\kappa_r^{RA}(\theta_I)$ of the scatterer are estimated for each incident angle individually. The expected contrast factor is calculated, and then, the boundaries are localized by applying segmentation. The non-radiating VECS and the non-radiating contrast factor are also needed to be determined after calculating the radiating VECS and radiating contrast factor, and localizing the scatterer boundary.

For obtaining the non-radiating solution, to estimate the contrast factor accurately, the total VECS, $J_{eq}$, is assumed to consist of the radiating VECS, $J_{eq}^{RA}$, and the non-radiating VECS, $J_{eq}^{NR}$. The non-radiating term of VECS is defined by satisfying the internal forward scattering equation, $$E_s^{int} = G_e^{int}(J_{eq}^{RA} + J_{eq}^{NR}), \quad (4)$$

and the non-radiating VECS is defined:

$$0 = G_e^{ext} J_{eq}^{NR}. \quad (5)$$

Equation (5) is considered as the cost function for the proposed permittivity profile estimation approach. The contrast factor is defined as a sum of the radiating ($\kappa_r^{RA}$) and the non-radiating ($\kappa_r^{NR}$) parts.

$$\kappa_r = \kappa_r^{RA} + \kappa_r^{NR} \quad (6)$$

To obtain the total VECS, both the radiating part and the non-radiating part of VECS can be estimated as follows:

$$J_{eq}^{RA} = j\Omega\epsilon_0 \kappa_r^{RA}(E_t^{int\ RA}), \quad (7)$$

$$J_{eq}^{NR} = j\omega\epsilon_0(\kappa_r^{RA} + \kappa_r^{NR})(j\omega\epsilon_0 Q\ G_a^{int}\kappa_r^{NR} + j\omega\epsilon_0\kappa_r^{NR}) E_t^{int\ RA}, \quad (8)$$

Where Q is $$Q = (I - j\omega\epsilon_0 G_e^{int}(\kappa_r^{RA} + \kappa_r^{NR}))^{-1}, \quad (9)$$

and I is the q×q identity matrix. The equations (5), (6), and (8) are solved simultaneously to determine the non-radiating VECS and the non-radiating contrast factor, and the total contrast factor. For this purpose, rather than trying to solve (5) directly, we seek for the contrast factors that minimize the l²-Norm of the external scattered field due to the non-radiating VECS, $\|G_e^{int}J_{eq}^{NR}\|$. Provided that the permittivity profile under the test consists of the m' number of non-homogenous scatterers, and the n' distinct number of test permittivities is considered within the acceptable range for each scatterer, the optimum answer to the permittivity profile estimation is the contrast factor profile minimizing $\|G_e^{int}J_{eq}^{NR}\|$. The estimated total contrast factor, $\kappa_r^*$, minimizes $\|G_e^{int}J_{eq}^{NR}\|$ or maximizes the likelihood, which is known as Maximum Likelihood (ML), $$\kappa_r^* = \arg\max\ p(\|G_e^{int}J_{eq}^{NR}\|/\kappa_r^i) \quad (10)$$

where P $(\|G_e^{int}J_{eq}^{NR}\|/\kappa_r^i)$ represents the likelihood of KY with respect to $\|G_e^{int}J_{eq}^{NR}\|$; Equation (10) implies that the estimated total contrast factor, for which p $(\|G_e^{int}J_{eq}^{NR}\|/\kappa_r^i)$ is the largest, is the most likely to be the correct contrast factor; and KY is the diagonal contrast factor matrix for the $i^{th}$ test permittivity set. Subdivided into the m' number of homogenous subregions, the contrast factor of an inhomogeneous region is defined as a block diagonal matrix $\kappa_r^i$, $$\kappa_r^i = \begin{bmatrix} \kappa_r^{i1} & 0 & \cdots & 0 \\ 0 & \kappa_r^{i2} & \cdots & 0 \\ \vdots & \vdots & \ddots & \vdots \\ 0 & 0 & \cdots & \kappa_r^{im'} \end{bmatrix}, \text{ and} \quad (11)$$

$$\kappa_r^{ij} = \varsigma_r^{ij}\ I, \text{ where } \begin{cases} j = 1, 2, \ldots, m' \\ i = 1, 2, \ldots, n' \end{cases},$$

and I is the $q_j \times q_j$ identity matrix; $q_j$ is the number of elements in the $j^{th}$ subregion of $v_1$; the sum of all the $q_j$, (j=1, 2, ..., m') is the total elements, q, considered for the contrast factor estimation; and $\kappa_r^{ij}$ is a contrast factor of the jth subregion from the $i^{th}$ test permittivity set.

It will be appreciated by one skilled in the art that variants can exist in the above-described arrangements and applications. The specific examples provided herein are examples only and the materials, methods of application and arrangements of the invention can be applied to other similar areas.

The scope of the claims should not be limited by the preferred embodiments set forth in the examples, but should be given the broadest interpretation consistent with the description as a whole.

What is claimed is:

1. A method of estimating the permittivity profile using data collected at observation points comprising the steps of:
   (a) measuring incident electric fields over the observation points in the absence of any scatterers;
   (b) illuminating a scatterer from different angles;
   (c) measuring total electric fields at the observation points for different angles in the presence of the scatterer for a full revolution;
   (d) calculating a radiating volume equivalent current source (VECS), a radiating total internal electric field, and a radiating contrast factor of the scatterer for each incident angle;
   (e) determining an expected contrast factor and localizing boundaries of the scatterer;
   (f) estimating the permittivity profile of OUT; and
   (g) determining the conductivity profile of OUT utilizing the following equation:

$$\kappa_r = \epsilon_r - 1 - j\frac{\sigma}{\omega\epsilon_0},$$

$\epsilon_r$, $\epsilon_0$, $\omega$, and $\sigma$ are relative permittivity, free space permittivity, angular frequency, and conductivity respectively.

2. A method comprising:
   irradiating an object under test (OUT) from multi-views to minimize noise and multipath effects, and enhance image reconstruction,
   using a bistatic mm-wave non-linear imaging system for reconstructing tomographic images and estimating conductivity and permittivity profiles by performing the following steps,
   (a) measuring incident electric fields over an observation plane in the absence of any scatterers;
   (b) illuminating a scatterer from different angles;
   (c) measuring total electric fields at the observation plane for different angles in the presence of the scatterer for a full revolution;
   (d) calculating a radiating volume equivalent current source (VECS), a radiating total internal electric field, and a radiating contrast factor of the scatterer for each incident angle;
   (e) determining an expected contrast factor and localizing boundaries of the scatterer;
   (f) estimating the permittivity map of the OUT; and
   (g) determining the conductivity map of the OUT utilizing the following equation:

$$\kappa_r = \epsilon_r - 1 - j\frac{\sigma}{\omega\epsilon_0},$$

$\epsilon_r$, $\epsilon_0$, $\omega$, and $\sigma$ are relative permittivity, free space permittivity, angular frequency, and conductivity respectively.

* * * * *